United States Patent
Abo et al.

(10) Patent No.: US 9,067,460 B2
(45) Date of Patent: Jun. 30, 2015

(54) DRY ETCHING METHOD

(71) Applicant: CANON KABUSHIKI KAISHA, Tokyo (JP)

(72) Inventors: Hiroyuki Abo, Kawasaki (JP); Toshiyasu Sakai, Kawasaki (JP); Kazuya Abe, Fukushima (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/926,636

(22) Filed: Jun. 25, 2013

(65) Prior Publication Data

US 2014/0008322 A1    Jan. 9, 2014

(30) Foreign Application Priority Data

Jul. 3, 2012   (JP) .................. 2012-149606

(51) Int. Cl.
*B44C 1/22*     (2006.01)
*B41J 2/16*     (2006.01)
*H01L 21/3065*  (2006.01)

(52) U.S. Cl.
CPC .............. *B44C 1/227* (2013.01); *B41J 2/1628* (2013.01); *H01L 21/3065* (2013.01); *B41J 2/1631* (2013.01); *B41J 2/1639* (2013.01)

(58) Field of Classification Search
CPC ..... G03F 7/0046; B41J 2/1631; B41J 2/1628; B41J 2/01; B44C 1/227; H01L 21/3065; H01L 21/308; H01L 21/31058; H01L 21/3088

USPC ............... 216/27, 34, 41, 47, 58, 67, 81, 4, 7; 438/706, 710, 714, 716, 725

See application file for complete search history.

(56) References Cited

U.S. PATENT DOCUMENTS

| | | | |
|---|---|---|---|
| 5,478,606 A | | 12/1995 | Ohkuma et al. |
| 6,757,032 B1 * | | 6/2004 | Zhang et al. .................. 349/44 |
| 7,637,013 B2 * | | 12/2009 | Hayakawa .................. 29/890.1 |
| 2002/0011673 A1 * | | 1/2002 | Uzoh ............................. 257/758 |
| 2002/0039704 A1 * | | 4/2002 | Din et al. ...................... 430/313 |
| 2003/0176058 A1 * | | 9/2003 | Weidman et al. ............. 438/638 |
| 2007/0128886 A1 * | | 6/2007 | Ogihara et al. ............... 438/780 |
| 2008/0145998 A1 * | | 6/2008 | Delgadino et al. ............ 438/401 |
| 2012/0058582 A1 * | | 3/2012 | Tsuji .............................. 438/32 |

FOREIGN PATENT DOCUMENTS

| | | |
|---|---|---|
| JP | 54-51837 A | 4/1979 |
| JP | 6-286149 A | 10/1994 |
| JP | 2002-347254 A | 12/2002 |

* cited by examiner

*Primary Examiner* — Lan Vinh

(74) *Attorney, Agent, or Firm* — Fitzpatrick, Cella, Harper & Scinto

(57) ABSTRACT

According to one aspect of the present invention, there is provided a dry etching method which carries out patterning of a resin film provided on a substrate, by reactive ion etching using a resist mask, wherein a gas mixture containing $CF_4$ gas with a percentage flow rate of 1.0 to 5.0% is used as an etching gas; and pressure in an etching reaction chamber in an apparatus used for the reactive ion etching is 1.0 Pa or more.

17 Claims, 3 Drawing Sheets

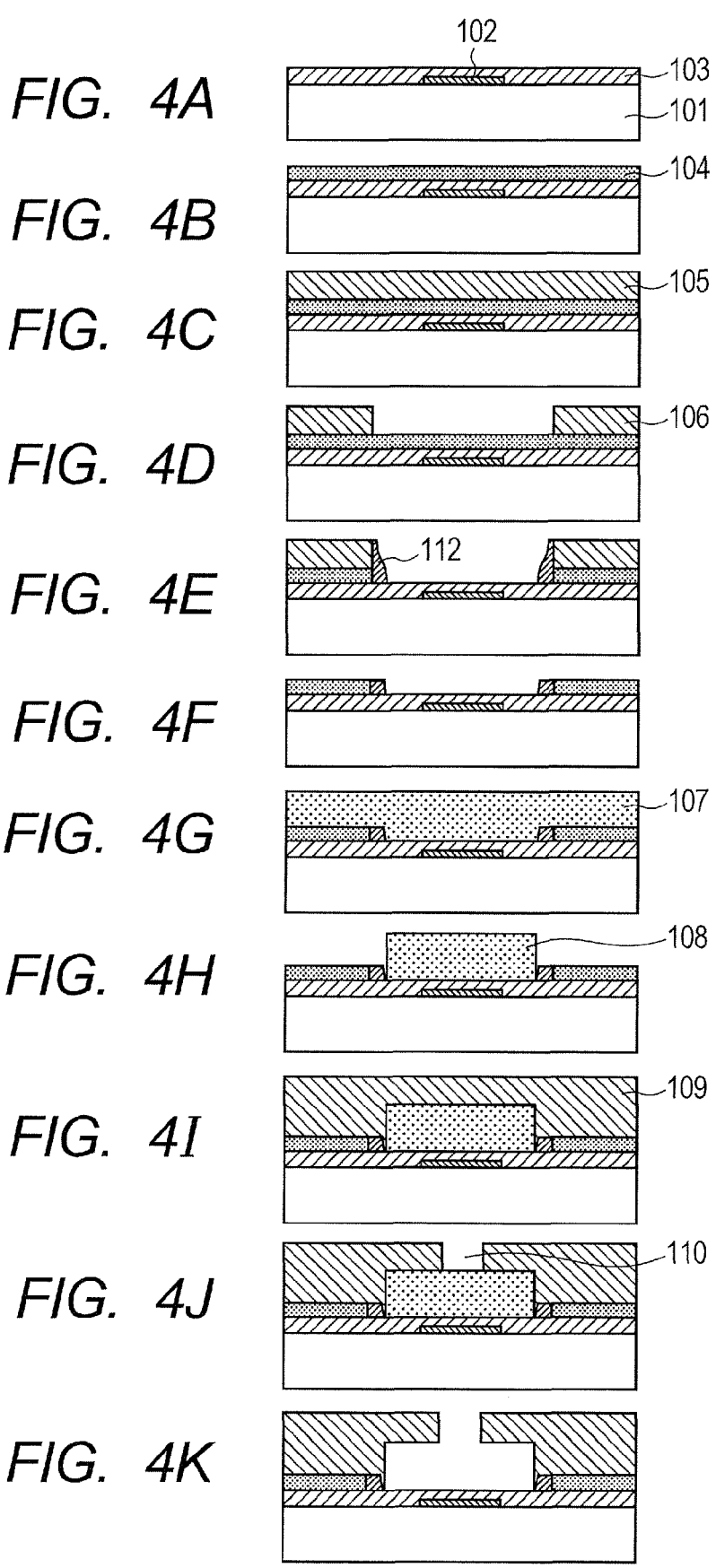

DRY ETCHING METHOD

BACKGROUND OF THE INVENTION

1. Field of the Invention

The present invention relates to a dry etching method used to perform patterning of a resin film.

2. Description of the Related Art

An ink-jet recording head described, for example, in Japanese Patent Application Laid-Open No. S54-51837, applies thermal energy to a liquid to obtain a driving force for liquid droplet discharge. With a recording method disclosed in Japanese Patent Application Laid-Open No. S54-51837, air bubbles are formed when the liquid is heated by the action of the thermal energy. Under the action force of the bubble formation, liquid droplets are discharged through a discharge port provided in a coating resin layer of a recording head portion. Then, the liquid droplets attach to recording material, thereby recording information.

The ink-jet recording head to which such a recording method is applied generally has a coating resin layer provided with a discharge port adapted to discharge a liquid. The coating resin layer makes up a liquid flow path communicated with the discharge port and provided with a thermal action unit as a component, where the thermal action unit is adapted to discharge liquid droplets. Also, the ink-jet recording head includes a substrate which has a heater resistor (discharge energy generating element) at a location corresponding to the thermal action unit, where the heater resistor is a means of generating thermal energy. The substrate includes an upper protective layer adapted to protect the heater resistor from the liquid, a lower layer adapted to store heat, and the like.

Examples of methods for forming such an ink-jet recording head include manufacturing methods described in Japanese Patent Application Laid-Open Nos. H06-286149 and 2002-347254.

SUMMARY OF THE INVENTION

According to one aspect of the present invention, there is provided a dry etching method which carries out patterning of a resin film provided on a substrate, by reactive ion etching using a resist mask, wherein a gas mixture containing $CF_4$ gas with a percentage flow rate of 1.0 to 5.0% is used as an etching gas; and pressure in an etching reaction chamber in an apparatus used for the reactive ion etching is 1.0 Pa or more.

Also, according to one aspect of the present invention, there is provided a method for manufacturing a liquid discharge head which includes a substrate having a discharge energy generating element on a side of a first surface, and a coating resin layer provided on the first surface of the substrate, where the discharge energy generating element is adapted to generate energy used to discharge a liquid and the coating resin layer makes up at least a liquid flow path through which the liquid flows, the method comprising: (1) carrying out patterning of an adhesion improvement film provided on the first surface of the substrate, by reactive ion etching; (2) forming the coating resin layer on the adhesion improvement film subjected to the patterning, wherein the patterning of the adhesion improvement layer by the reactive ion etching is carried out using the dry etching method.

Further features of the present invention will become apparent from the following description of exemplary embodiments with reference to the attached drawings.

BRIEF DESCRIPTION OF THE DRAWINGS

FIGS. 4A, 4B, 4C, 4D, 4E, 4F, 4G, 4H, 4I, 4J and 4K are schematic sectional process charts for illustrating a conventional method for manufacturing an ink-jet recording head.

DESCRIPTION OF THE EMBODIMENTS

Preferred embodiments of the present invention will now be described in detail in accordance with the accompanying drawings.

FIGS. 4A to 4K are schematic sectional process charts showing a conventional method for manufacturing an ink-jet recording head based on Japanese Patent Application Laid-Open No. 2002-347254, where an adhesion improvement film is formed on a substrate to improve adhesion to a coating resin layer. If patterning of the adhesion improvement film is performed using reactive ion etching to improve the patterning accuracy of the adhesion improvement film, residual matter 112 of etch residues may attach to side walls of the adhesion improvement film after the patterning as shown in FIG. 4E. The residual matter 112 of etching is a fluorinated product including fluorine ions, and if the residual matter attaches to the side walls of the adhesion improvement film, adhesion to the coating resin layer degrades due to boundary separation from the adhesion improvement film, eventually reducing the yields and reliability of the ink-jet recording head.

Furthermore, in recent years, flow path walls in a nozzle have been narrowed along with increases in the accuracy of the ink-jet recording head, resulting in demand for higher patterning accuracy of the adhesion improvement film.

Thus, an object of the present invention is to provide a dry etching method for resin films, the method being capable of preventing residual matter from attaching to side walls of the etched part.

Desirably, an object of the present invention is to provide a dry etching method capable of preventing residual matter of etch residues from attaching to side walls of the etched part after patterning of an adhesion improvement film. More desirably an object of the present invention is to provide a method for manufacturing a liquid discharge head, the method being capable of stabilizing adhesion between the adhesion improvement film and a coating resin layer and providing high yields and high reliability, based on the above form.

Embodiments of the present invention will be described below. Although an ink-jet recording head is described herein as an application example of the present invention, the scope of the present invention is not limited to this. Besides, manufacturing methods according to the present invention are also applicable to liquid discharge heads used in fabrication of biochips and printing of electronic circuits. Examples of the liquid discharge heads include a head used for color filter production in addition to the ink-jet recording head.

Embodiments of the present invention will be described below with reference to the drawings.

Figure 2:
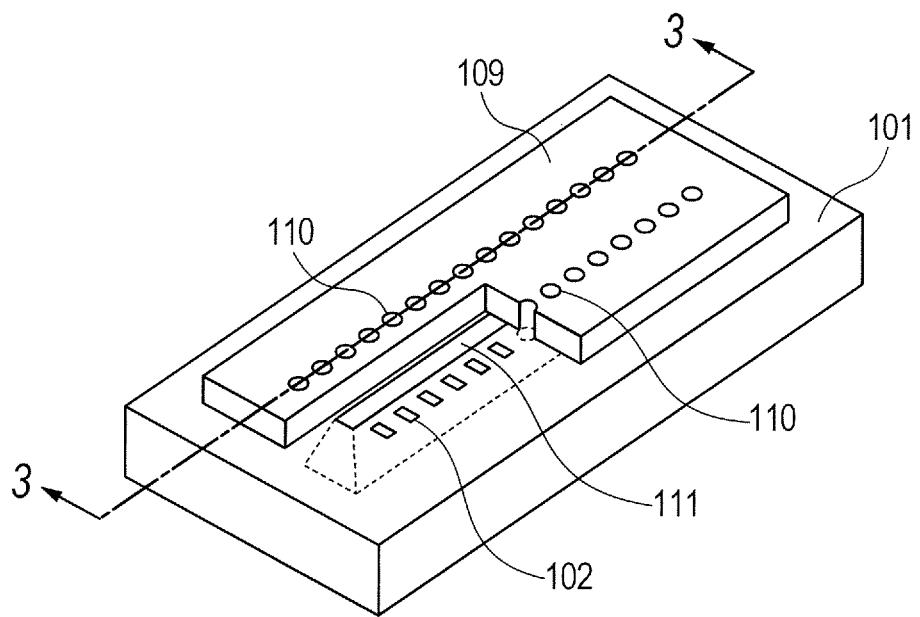
FIG. 2 is a schematic perspective view for illustrating a configuration example of the ink-jet recording head manufactured according to the present embodiment.
Figure 3:
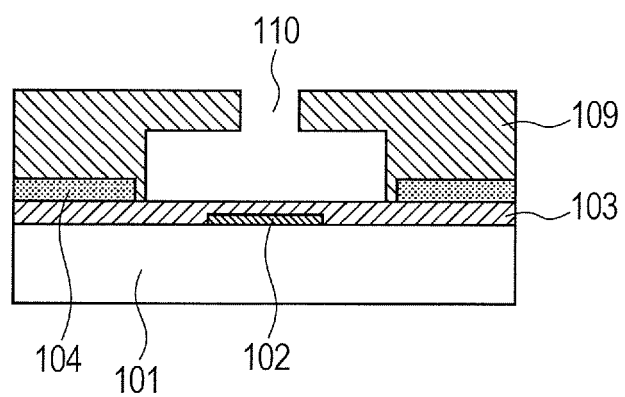
FIG. 3 is a schematic sectional view for illustrating a configuration example of the ink-jet recording head manufactured according to the present embodiment, the sectional view being taken along dotted line 3-3 in FIG. 2.

FIG. 2 shows a schematic diagram of an ink-jet recording head manufactured according to the present embodiment. The ink-jet recording head includes a substrate 101 on which two lines of discharge energy generating elements 102 such as heater resistors are arranged at predetermined intervals on the side of a first surface. An ink supply port (liquid supply port) 111 is provided in the substrate 101 by penetrating through the substrate so as to open between the two lines of discharge energy generating elements 102. A coating resin layer 109 is provided on the substrate 101. The coating resin layer 109 forming ink discharge ports (liquid discharge ports) 110 which open above respective discharge energy generating elements 102 and an ink flow path (liquid flow path) which communicated with between the ink discharge ports 110 and the ink supply port 111. The ink-jet recording head is placed so that a surface in which the ink discharge ports 110 are formed faces a recording surface of a recording medium. The ink-jet recording head discharges liquid droplets through the ink discharge ports 110 by applying pressure generated by the discharge energy generating elements 102 to a liquid filled into the ink flow path through the ink supply port 111. Then, recording is done as the liquid droplets attach to the recording medium.

First Embodiment

A method for manufacturing an ink-jet recording head according to the present embodiment will be described below with reference to FIG. 1.

Figure 1:
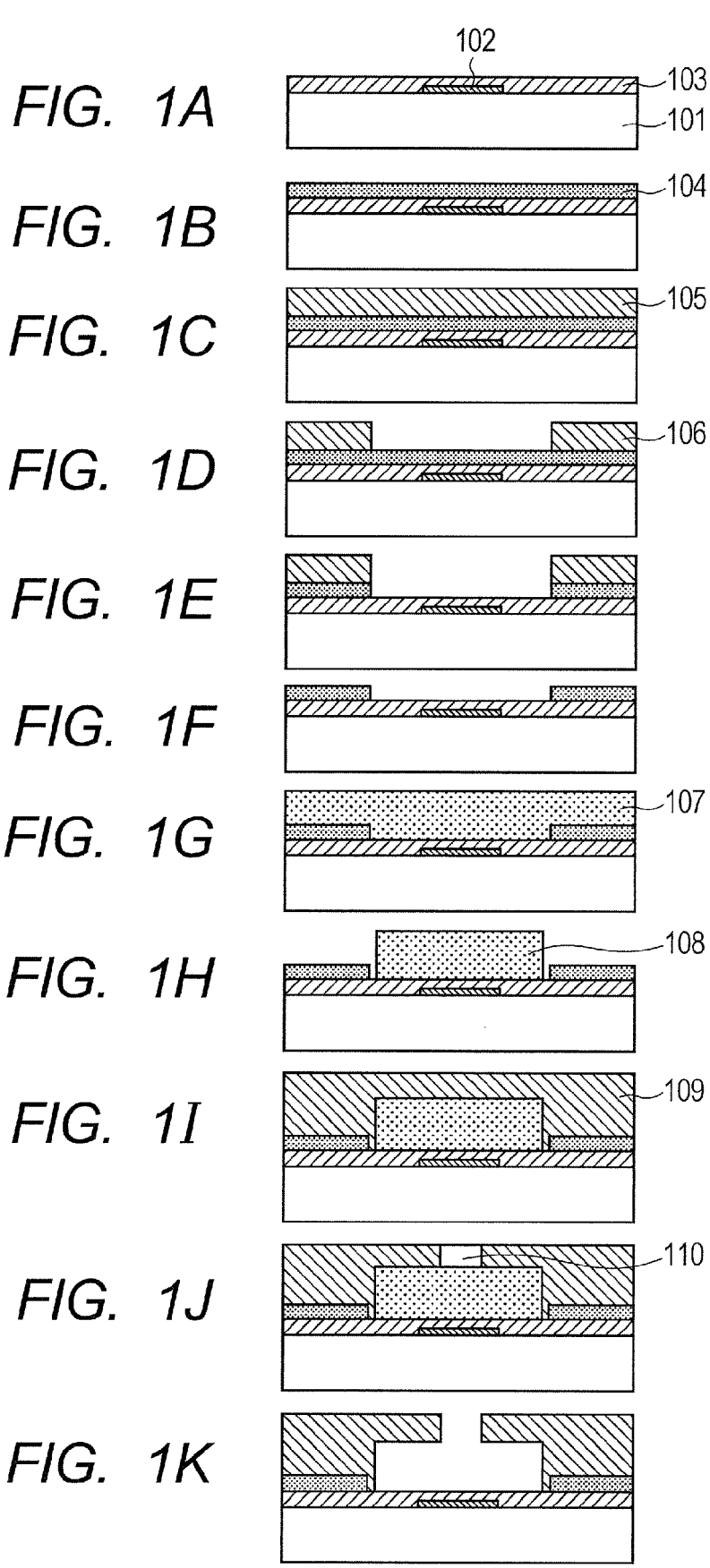
FIGS. 1A, 1B, 1C, 1D, 1E, 1F, 1G, 1H, 1I, 1J and 1K are schematic sectional process charts for illustrating a method for manufacturing an ink-jet recording head according an embodiment of the present invention.

First, as shown in FIG. 1, the substrate 101 having the discharge energy generating element 102 on the side of the first surface is prepared. A protective film 103 is provided on the substrate 101 and discharge energy generating element 102.

Available materials for the protective film include, for example, SiO, SiN, SiON and Ta, among which SiN and Ta are desirable.

Next, as shown in FIG. 1B, an adhesion improvement film 104 made of resin (polyether amide) is formed on the first surface (hereinafter also referred to as the front face) of the substrate 101. To the adhesion improvement film 104, a resin can be applied, for example, by spin coating or the like, then baked, and cured.

In so doing, a polyether amide resin may also be provided on a second surface (hereinafter also referred to as the rear face) which is on the opposite side of the substrate from the first surface. Incidentally, the polyether amide resin on the rear face is not illustrated.

Although the adhesion improvement film has been described herein, a normal resin film may be used rather than a film intended to improve adhesion. Available resins include, for example, acrylic resins and epoxy resins. In particular, it is desirable that the resin used is curable by UV light or heat and capable of thin-film curing, and more desirable that the resin also has the property of improving adhesion.

Desirably the resin used for the adhesion improvement film has an alkali resistance effect and molecular bonding effect as well as the effect of dispersing stresses produced by the coating resin layer 109.

Available materials for the adhesion improvement film include, for example, polyamide resins, epoxy resins and light-curing acrylate resins, among which polyamide resins are desirable.

In the examples described below, a non-photosensitive polyamide resin was used as the adhesion improvement film.

Also, after a positive photoresist is applied onto the polyether amide resin on the rear face, exposed and, developed, a patterning mask for use in forming the ink supply port 111 can be formed through patterning of the polyether amide resin by dry etching or the like. After the patterning mask is formed, the positive photoresist may be removed (not shown).

Next, as shown in FIG. 1C, a photoresist 105 such as a positive photoresist is formed on the adhesion improvement film 104.

The photoresist 105 can be formed by being applied by spin coating or the like.

Next, as shown in FIG. 1D, the photoresist 105 is exposed and developed, thereby forming a resist mask 106 to be used as a mask in etching the adhesion improvement layer in a subsequent step.

Next, as shown in FIG. 1E, patterning of the adhesion improvement film 104 is carried out using reactive ion etching.

An etching apparatus is not particularly limited, but an NLD-RIE (neutral loop discharge reactive ion etching) apparatus (produced by ULVAC, Inc.) can be used.

Etching conditions for the reactive ion etching are set as follows.

Desirably, a total flow rate of etching gas is 400 sccm or less, and more desirably 300 sccm or less. Also, since too low a total flow rate results in a decreased etch rate, desirably the total flow rate is 100 sccm or more, and more desirable 200 sccm or more.

In the total absence of $CF_4$ gas, etching reaction becomes less intense. Conversely, when $CF_4$ gas is supplied excessively, carbon contained in the $CF_4$ gas inhibits the etching reaction. Therefore, a gas mixture containing $CF_4$ gas with a percentage flow rate of 1.0 to 5.0% is used as the etching gas. Besides, in addition to $CF_4$, the etching gas can contain $CHF_3$, $SF_6$ and $NF_3$. Desirably, the etching gas is a gas mixture of $CF_4$ and $O_2$.

The pressure in the etching reaction chamber in an etching gas apparatus is set to 1.0 Pa or above because in a low pressure state, a mean free path (mean distance at which gas molecules collide with other molecules) is long, resulting in perpendicular incidence of ions, thereby increasing anisotropy, and thereby making residues prone to be produced on side walls. Conversely, in a high pressure state, in which isotropy increases, making it difficult to form patterns accurately, desirably the pressure is set to 10.0 Pa or below.

In the present embodiment, desirably reactive ion etching is performed as follows.

As a first stage of etching, antenna power (also referred to as first high-frequency antenna power) is set. When electric energy of antenna power is increased, radical generating capacity increases, and etch characteristics lean toward isotropy. Therefore, in the first stage of etching, in which anisotropy is required, an aspect ratio of anisotropic etch rate is taken into consideration. Specifically, the first high-frequency antenna electricity can be set to 1000 to 3000 w (e.g., 2000 w), and is desirably set to 1500 to 2500 w. Also, when electric energy of bias power (also referred to as first high-frequency bias power) is increased, the strength of an electric field generated by a cathode fall increases, causing a larger quantity of positive ions to be incident perpendicularly upon an object to be etched, and thereby enabling etching with high anisotropy. However, this involves increased damage to an underlayer, and thus care need to be exercised. In the first stage of etching, which does not expose the underlayer, desirably etching conditions with high anisotropy is set by increasing the electric energy of bias power. Specifically, the first high-frequency bias power can be set to 450 to 1050 w (e.g., 750 w), and is desirably set to 700 to 800 w.

Then, in the first stage of etching, the etching time needed to remove 5 to 95% or more of the adhesion improvement film 104 in film thickness is set appropriately by counting from the start of etching, and then etching is performed.

Next, in a second stage of etching, the antenna power (also referred to as second high-frequency antenna power) is set to a value higher than in the first stage of etching without changing the etching gas and pressure setting from the first stage of etching. Also, the bias power (also referred to as second high-frequency bias power) is set to a value lower than in the first stage of etching. In the second stage, etching is carried out to an etching end point (until the protective film 103 is exposed).

As the antenna power is set to a value higher than in the first stage of etching, isotropy of etching characteristics is increased and the residues produced on the side walls of the adhesion improvement film in the first stage of etching can be removed properly. Also, in the second stage of etching, there is concern that the underlying protective film 103 might be exposed during etching, damaging the protective film 103 (producing etching reaction products), and thus it is desirable to perform the second stage of etching at a lower value of bias power than in the first stage.

In the second stage, the antenna power can be set, for example, to 2000 to 4000 w (e.g., 3000 w), and is desirably set to 2500 to 3500 w. In the second stage, the bias power can be set, for example, to 30 to 70 w (e.g., 50 w), and is desirably set to 40 to 60 w. In the second stage, desirably the antenna power is 1000 w or more higher than the antenna power in the first stage, more desirably 1500 w or more higher, and still more desirably 2000 or more higher. Also, in the second stage, desirably the bias power is 660 w or more lower than the bias power in the first stage, more desirably 700 w or more lower, and still more desirably 760 w or more lower.

Note that an end point detection system may be used in the second stage of etching to improve the accuracy of recognizing the etching end point.

After the etching end point, overetching can be performed as a third stage of etching. In the third stage, the antenna power can be set, for example, to 2000 to 4000 w (e.g., 3000 w), and is desirably set to 2500 to 3500 w. In the third stage, the bias power can be set, for example, to 30 to 70 w (e.g., 50 w), and is desirably set to 40 to 60 w. In the third stage of etching, the conditions of the etching gas, pressure, antenna power and bias power can be the same as in the second stage described above. Also, the etching time in the third stage can be same as in the second stage.

Desirably, the etching time for the third stage of etching is set by taking into consideration relationships with etch rate distribution, finish dimensions of an etching mask 106, and desired etching accuracy of the adhesion improvement film 104.

Next, as shown in FIG. 1G, a mold material 107, which is a material for a flow path mold, is placed by being applied to the substrate by spin coating or the like, where the flow path mold is used as a mold in creating an ink flow path.

Next, as shown in FIG. 1H, the mold material 107 is exposed to UV light or deep UV light and developed to form the flow path mold 108 which is used as a mold in creating an ink flow path.

Next, as shown in FIG. 1I, the coating resin layer 109 is applied and thereby placed onto the flow path mold 108 and adhesion improvement layer by spin coating or the like.

Note that a water-repellent layer may be formed on the coating resin layer 109 using a dry film laminate or the like.

Next, as shown in FIG. 1J, the ink discharge ports 110 are formed in the coating resin layer 109 by exposure and development using an i-line stepper.

After the formation of the ink discharge port 110, the front face and side faces of the substrate 101 are covered by a protection material. The protection material is well able to withstand a strong alkaline solution used when anisotropic etching is performed. Alkali wet etching using the protection material enables preventing water-repellent material from being deteriorated. After coating the front face and side faces with the protection material, an ink supply port is formed by alkali wet etching using a patterning mask formed by patterning on the rear face of the substrate 101 (not shown).

Then, after the protection material is removed, ink flow path walls are formed by eluting the flow path mold 108 from the ink supply port and ink discharge port 110, as shown in FIG. 1K. The flow path mold 108 can be removed through exposure to deep UV light, followed by development and drying. During the development, ultrasound immersion can be performed as required.

Through the above steps, the substrate 101 with a nozzle portion formed thereon is cut and separated into chips using a dicing saw or the like and electrical connections needed to drive the heater resistors 102 are made. Subsequently, a tip tank member for ink supply is connected, completing the ink-jet recording head.

EXAMPLES

Example 1

Based on the embodiment described above, an ink-jet recording head was formed, and the presence or absence of etch residues as well as adhesion between an adhesion improvement film and coating resin layer were evaluated after reactive ion etching.

The adhesion improvement film was formed by applying a non-photosensitive polyamide resin (produced by Hitachi Chemical Company, Ltd. under the trade name of HL-1200) onto a SiN protective film using a spin coating method, and then baking (250° C.) and thereby curing the resin. The adhesion improvement film thus formed was 2 μm in thickness.

As a material for the resist mask 106, a novolac resin (produced by TOKYO OHKA KOGYO Co., Ltd. under the trade name of THMR-ip5700HP) was used. The novolac resin was applied onto the adhesion improvement film by a spin coating method, then exposed, and developed to form the resist mask 106. The resist mask 106 thus formed was 5 μm in thickness.

Next, patterning of the adhesion improvement layer was performed by reactive ion etching using the resist mask 106.

An NLD-RIE apparatus (produced by ULVAC, Inc. under the trade name of NLD-6000) was used as an etching apparatus.

Etching conditions for the reactive ion etching will be described below.

The total flow rate of etching gas was set to 200 sccm. Also, a gas mixture of $CF_4$ and $O_2$ was used as the etching gas, where the flow rate of $CF_4$ was 2.5 sccm and the flow rate of $O_2$ was 197.5 sccm (percentage flow rate of $CF_4$ was 1.25%).

The pressure was set to 6.0 Pa in consideration of etching distribution.

The antenna power was set to 2000 w and the bias power was set to 750 w.

First, as the first stage of etching, the etching time was set to a value large enough to remove a film thickness of 1 μm from the adhesion improvement film 104 under the above conditions. Because the etch rate of the adhesion improvement film under the above conditions was 2.3 μm/min, the etching time here was set to 26 sec.

Next, as the second stage of etching, the antenna power was set to a value (3000 w) higher than in the first stage and the bias power was set to a value (50 w) lower than in first stage without changing the etching gas and the pressure setting, and etching was carried out to the etching end point. An end point detection system was used in the second stage of etching to improve the accuracy of recognizing the etching end point.

Then, as the third stage of etching, overetching was performed after the etching end point. In Example 1, the etching conditions of the etching gas, pressure, antenna power, and bias power in the third stage were the same as the etching conditions for the second stage. The etching time was also the same as the etching time in the second stage.

After patterning of the adhesion improvement film, the coating resin layer was formed as described in the above embodiment.

Through the above steps, the substrate with a nozzle portion formed thereon was cut and separated into chips using a dicing saw or the like and electrical connections needed to drive the heater resistors 102 were made. Subsequently, a tip tank member for ink supply was connected, thereby building the ink-jet recording head.

Regarding the adhesion improvement film and ink-jet recording head thus obtained, the presence or absence of etch residues and adhesion were evaluated.

<Etch Residues>

Regarding etch residues, the side walls of the adhesion improvement film subjected to patterning were observed under a scanning electron microscope and evaluated. When fluorinated products, which were etch residues, were adhering to the side walls, a decision of "residues present" was made, and fluorinated products were not adhering, a decision of "no residues" was made.

<Adhesion>

After immersion in ink of the chip on which a nozzle portion was formed, a pressure cooker test was conducted at 121° C. and 2 atm, with an immersion time of 10 hours using TPC-412M produced by ESPEC Corp., and the adhesion between the adhesion improvement film and flow path wall was evaluated. A rating of "AA" was given when the interface between the adhesion improvement film and flow path wall was not penetrated by ink and a rating of "A" was given when the interface between the adhesion improvement film and flow path wall was penetrated slightly by ink.

Example 2

Patterning of an adhesion improvement layer was performed and an ink-jet recording head was built under the same conditions as in Example 1 except that the percentage of $CF_4$ gas was 1.0%. Also, evaluations were made in the same manner as in Example 1.

Example 3

Patterning of an adhesion improvement layer was performed and an ink-jet recording head was built under the same conditions as in Example 1 except that the percentage of $CF_4$ gas was 5.0%. Also, evaluations were made in the same manner as in Example 1.

Example 4

Patterning of an adhesion improvement layer was performed and an ink-jet recording head was built under the same conditions as in Example 1 except that the percentage of $CF_4$ gas was 1.25%. Also, evaluations were made in the same manner as in Example 1.

Comparative Example 1

Patterning of an adhesion improvement layer was performed and an ink-jet recording head was built under the same conditions as in Example 1 except that the percentage of $CF_4$ gas was 0%. Also, evaluations were made in the same manner as in Example 1. In the complete absence of $CF_4$ gas used to purify $O_2$ plasma which contributes to etching, since etching reaction becomes less intense, etch residues were produced in Comparative Example 1.

Comparative Example 2

Patterning of an adhesion improvement layer was performed and an ink-jet recording head was built under the same conditions as in Example 1 except that the percentage of $CF_4$ gas was 10.0%. Also, evaluations were made in the same manner as in Example 1. When $CF_4$ gas is supplied excessively, since the carbon contained in the $CF_4$ gas tends to inhibit etching reaction, etch residues were produced in Comparative Example 2.

Comparative Example 3

Patterning of an adhesion improvement layer was performed and an ink-jet recording head was built under the same conditions as in Example 1 except that the percentage of $CF_4$ gas was 5.0% and the pressure was 0.5 Pa. Also, evaluations were made in the same manner as in Example 1. When the pressure is lowered, etch characteristics lean toward anisotropy, making residues prone to remain on the side walls, and thus etch residues were produced in Comparative Example 3.

Comparative Example 4

Patterning of an adhesion improvement layer was performed and an ink-jet recording head was built under the same conditions as in Example 1 except that the percentage of $CF_4$ gas was 0.9%. Also, evaluations were made in the same manner as in Example 1. As a result, it was confirmed that etch residues had been produced.

Comparative Example 5

Patterning of an adhesion improvement layer was performed and an ink-jet recording head was built under the same conditions as in Example 1 except that the percentage of $CF_4$ gas was 6.0%. Also, evaluations were made in the same manner as in Example 1. As a result, it was confirmed that etch residues had been produced.

Results obtained in the examples and comparative examples described above are summarized in Table 1.

TABLE 1

| | $CF_4$ gas | | | | |
| --- | --- | --- | --- | --- | --- |
| | Flow rate (sccm) | Percentage (%) | Pressure (Pa) | Etch residues | Adhesion |
| Example 1 | 2.5 | 1.25 | 6.0 | No residues | AA |
| Example 2 | 2.0 | 1.0 | 6.0 | No residues | AA |
| Example 3 | 10.0 | 5.0 | 6.0 | No residues | AA |
| Example 4 | 2.5 | 1.25 | 1.5 | No residues | AA |
| Comparative Example 1 | 0 | 0 | 6.0 | Residues present | A |
| Comparative Example 2 | 20.0 | 10.0 | 6.0 | Residues present | A |
| Comparative Example 3 | 10.0 | 5.0 | 0.5 | Residues present | A |

TABLE 1-continued

| | CF₄ gas | | | | |
|---|---|---|---|---|---|
| | Flow rate (sccm) | Percentage (%) | Pressure (Pa) | Etch residues | Adhesion |
| Comparative Example 4 | 1.8 | 0.9 | 6.0 | Residues present | A |
| Comparative Example 5 | 12.0 | 6.0 | 6.0 | Residues present | A |

One aspect of the present invention provides a dry etching method for resin films, the method being capable of preventing residues from attaching to side walls of the etched part.

Also, an exemplary aspect of the present invention allows an adhesion improvement film to be dry-etched by preventing residual matter of etch residues from attaching to side walls of the etched part, the residual matter of etch residues being generated after patterning. Consequently, an etching process can be performed accurately during patterning of the adhesion improvement film without increasing man-hours by adding a removal step or the like. Thus, the present invention provides a method for manufacturing a liquid discharge head, the method being capable of stabilizing adhesion between the adhesion improvement film and coating resin layer and providing high yields and high reliability.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-149606, filed Jul. 3, 2012, which is hereby incorporated by reference herein in its entirety.

What is claimed is:

1. A dry etching method comprising patterning a resin film provided on a substrate, by reactive ion etching using a resist mask,
    wherein a gas mixture containing $CF_4$ gas with a percentage flow rate of 1.0% to 1.25% is used as an etching gas,
    wherein a pressure in an etching reaction chamber in an apparatus used for the reactive ion etching is 1.0 Pa or more,
    wherein the reactive ion etching includes a first stage in which 5% to 95% of a thickness of the resin film is removed beginning with a start of etching, and a second stage in which etching is performed after the first stage,
    wherein high-frequency antenna power in the second stage is higher than high-frequency antenna power in the first stage, and
    wherein high-frequency bias power in the first stage is 450 W to 1050 W and high-frequency bias power in the second stage is 30 W to 70 W.

2. The dry etching method according to claim 1, wherein the resin film is made of an epoxy resin or a light-curing acrylate resin.

3. The dry etching method according to claim 1, wherein the resin film is made of a non-photosensitive polyamide resin.

4. The dry etching method according to claim 1, wherein the resin film is made of a polyamide resin.

5. The dry etching method according to claim 1, wherein the pressure is from 1.0 Pa to 10 Pa.

6. The dry etching method according to claim 1, wherein the high-frequency antenna power in the second stage is higher than the high-frequency antenna power in the first stage by 1000 W or more.

7. The dry etching method according to claim 6, wherein the high-frequency antenna power in the first stage is 1000 W to 3000 W and the high-frequency antenna power in the second stage is 2000 W to 4000 W.

8. A method for manufacturing a liquid discharge head which includes a substrate having a discharge energy generating element on a side of a first surface, and a coating resin layer provided on the first surface of the substrate, where the discharge energy generating element is adapted to generate energy used to discharge a liquid and the coating resin layer makes up at least a liquid flow path through which the liquid flows, the method comprising:
    (1) patterning an adhesion improvement film provided on the first surface of the substrate, by reactive ion etching;
    (2) forming the coating resin layer on the adhesion improvement film subjected to the patterning,
    wherein the reactive ion etching is carried out using a resist mask,
    wherein a gas mixture containing $CF_4$ gas with a percentage flow rate of 1.0% to 1.25% is used as an etching gas, and
    wherein a pressure in an etching reaction chamber in an apparatus used for the reactive ion etching is 1.0 Pa or more.

9. The method according to claim 8, wherein the adhesion improvement film is made of an epoxy resin or a light-curing acrylate resin.

10. The method according to claim 8, wherein the adhesion improvement film is made of a non-photosensitive polyamide resin.

11. The method according to claim 8, wherein the adhesion improvement film is made of a polyamide resin.

12. The method according to claim 8, wherein the pressure is from 1.0 Pa to 10 Pa.

13. The method according to claim 8, wherein the reactive ion etching includes a first stage in which 5% to 95% of a thickness of the adhesion improvement film is removed beginning with a start of etching, and a second stage in which etching is performed after the first stage.

14. The method according to claim 13, wherein high-frequency antenna power in the second stage is higher than high-frequency antenna power in the first stage.

15. The method according to claim 14, wherein high-frequency bias power in the first stage is 450 W to 1050 W and high-frequency bias power in the second stage is 30 W to 70 W.

16. The method according to claim 13, wherein the high-frequency antenna power in the second stage is higher than the high-frequency antenna power in the first stage by 1000 W or more.

17. The method according to claim 16, wherein the high-frequency antenna power in the first stage is 1000 W to 3000 W and the high-frequency antenna power in the second stage is 2000 W to 4000 W.

* * * * *